(12) United States Patent
Chu et al.

(10) Patent No.: US 7,830,657 B2
(45) Date of Patent: Nov. 9, 2010

(54) APPARATUS FOR FACILITATING COOLING OF AN ELECTRONICS RACK EMPLOYING A HEAT EXCHANGE ASSEMBLY MOUNTED TO AN OUTLET DOOR COVER OF THE ELECTRONICS RACK

(75) Inventors: Richard C. Chu, Hopewell Junction, NY (US); Michael J. Ellsworth, Jr., Lagrangeville, NY (US); Donald W. Porter, Highland, NY (US); Roger R. Schmidt, Poughkeepsie, NY (US); Robert E. Simons, Poughkeepsie, NY (US)

(73) Assignee: Vette Corp., Portsmouth, NH (US)

( * ) Notice: Subject to any disclaimer, the term of this patent is extended or adjusted under 35 U.S.C. 154(b) by 353 days.

(21) Appl. No.: 12/131,301

(22) Filed: Jun. 2, 2008

(65) Prior Publication Data
US 2008/0232069 A1    Sep. 25, 2008

Related U.S. Application Data

(63) Continuation of application No. 11/108,306, filed on Apr. 18, 2005, now Pat. No. 7,385,810.

(51) Int. Cl.
*H05K 7/20* (2006.01)
(52) U.S. Cl. .................. 361/679.46; 361/697; 361/703; 454/184; 165/104.33
(58) Field of Classification Search ............ 361/679.46, 361/697
See application file for complete search history.

(56) References Cited

U.S. PATENT DOCUMENTS

| 4,011,905 | A | 3/1977 | Millard |
| 5,467,250 | A | 11/1995 | Howard et al. |
| 6,164,369 | A | 12/2000 | Stoller |
| 6,462,944 | B1 | 10/2002 | Lin |
| 6,535,382 | B2 | 3/2003 | Bishop et al. |
| 6,760,221 | B2 | 7/2004 | Goth et al. |

(Continued)

OTHER PUBLICATIONS

"RackCooler—A Cool Solution for X-Treme Density Rack Enclosure Systems," Liebert Corporation, Product Brochure, 8 pgs. (2001).

(Continued)

*Primary Examiner*—Jayprakash N Gandhi
*Assistant Examiner*—Anthony Q Edwards
(74) *Attorney, Agent, or Firm*—Vern Maine & Associates

(57) ABSTRACT

An apparatus is provided for facilitating cooling of an electronics rack. The apparatus includes a heat exchange assembly mounted to an outlet door cover hingedly affixed to an air outlet side of the rack. The heat exchange assembly includes a support frame, an air-to-liquid heat exchanger, and first and second perforated planar surfaces covering first and second main sides, respectively, of the air-to-liquid heat exchanger. The heat exchanger is supported by the support frame and includes inlet and outlet plenums disposed adjacent to the edge of the outlet door cover hingedly mounted to the rack. Each plenum is in fluid communication with a respective connect coupling, and the heat exchanger further includes multiple horizontally-oriented heat exchange tube sections each having serpentine cooling channel with an inlet and an outlet coupled to the inlet plenum and outlet plenum, respectively. Fins extend from the heat exchange tube sections.

9 Claims, 10 Drawing Sheets

U.S. PATENT DOCUMENTS

| | | |
|---|---|---|
| 6,775,137 B2 | 8/2004 | Chu et al. |
| 6,819,563 B1 | 11/2004 | Chu et al. |
| 7,074,123 B2 * | 7/2006 | Bettridge et al. ............ 454/184 |
| 7,086,247 B2 | 8/2006 | Campbell et al. |
| 7,403,391 B2 * | 7/2008 | Germagian et al. ......... 361/695 |
| 2004/0177948 A1 | 9/2004 | Cho et al. |
| 2005/0231913 A1 | 10/2005 | Malone et al. |
| 2005/0243514 A1 * | 11/2005 | Malone et al. .............. 361/697 |
| 2006/0141921 A1 * | 6/2006 | Turek et al. ................. 454/184 |

OTHER PUBLICATIONS

Teague, Paul E., "One Cool Machine," Design News for Mechanical and Design Engineers, Internet Article, 6 pgs., (Feb. 7, 2005).

* cited by examiner

APPARATUS FOR FACILITATING COOLING OF AN ELECTRONICS RACK EMPLOYING A HEAT EXCHANGE ASSEMBLY MOUNTED TO AN OUTLET DOOR COVER OF THE ELECTRONICS RACK

CROSS-REFERENCE TO RELATED APPLICATION

This application is a continuation of co-pending U.S. patent application Ser. No. 11/108,306, filed Apr. 18, 2005, entitled "Apparatus and Method for Facilitating Cooling of an Electronics Rack Employing a Heat Exchange Assemble Mounted to an Outlet Door Cover of the Electronics Rack", by Chu et al., the entirety of which is hereby incorporated herein by reference.

TECHNICAL FIELD OF THE INVENTION

The present invention relates in general to apparatuses and methods for facilitating cooling of rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

The sensible heat load carried by the air exiting the rack is stressing the ability of the room air conditioning to effectively handle the load. This is especially true for large installations with "server farms" or large banks of computer racks close together. In such installations not only will the room air conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature or in a reduction in long term reliability of the components.

Thus, there is a need in the art for an apparatus and method for further facilitating cooling of rack-mounted electronics units, particularly in a large computer room installation relying on one or more room air conditioning units to cool the electronics racks.

SUMMARY OF THE INVENTION

The shortcomings of the prior art are overcome and additional advantages are provided through an apparatus for facilitating cooling of an electronics rack. The apparatus includes a heat exchange assembly which is configured to mount to an outlet door cover of the electronics rack, wherein air moves through the electronics rack from an inlet side to an outlet side thereof, and the outlet door cover is hingedly mounted along one edge to the electronics rack at the air outlet side of the electronics rack. The heat exchange assembly includes a support frame, an air-to-liquid heat exchanger, and first and second perforated planar surfaces. The support frame facilitates mounting of the heat exchange assembly to the outlet door cover. When mounted to the outlet door cover, the heat exchange assembly covers at least a portion of an opening in the outlet door cover to cool at least a portion of the air exiting the air outlet side of the electronics rack. The air-to-liquid heat exchanger is supported by the support frame and has an inlet plenum and an outlet plenum disposed along the edge of the outlet door cover hingedly mounted to the electronics rack when the heat exchange assembly is mounted to the outlet door cover. The inlet plenum and the outlet plenum are each in fluid communication with a respective connect coupling of the heat exchange assembly. The respective connect couplings residing along the edge of the outlet door cover hingedly mounted to the electronics rack when the heat exchange assembly is mounted to the outlet door cover. The air-to-liquid heat exchanger further includes multiple heat exchange tube sections. Each heat exchange tube section includes a coolant channel having an inlet and an outlet. Each coolant channel inlet is coupled to the inlet plenum and each coolant channel outlet is coupled to the outlet plenum. The heat exchanger further includes a plurality of fins extending from the heat exchange tube sections. The first perforated planar surface covers a first main side of the heat exchanger and the second perforated planar surface covers a second main side of the heat exchanger. Each perforated planar surface contains air flow openings to allow inlet-to-outlet air flow through the electronics rack to pass through the heat exchange assembly at the air outlet side of the electronics rack when the heat exchange assembly is mounted to the outlet door cover.

In another aspect, a cooled electronics system is provided. The cooled electronics system includes an electronics rack having an air inlet side and an air outlet side, at least one electronics drawer, and at least one air moving device. The air inlet and air outlet sides respectively enable ingress and egress of external air, while the at least one air moving device is capable of causing external air flow from the air inlet side of the electronics rack across the at least one electronics drawer to the air outlet side of the electronics rack. The electronics rack further includes an outlet door cover hingedly mounted along one edge to the electronics rack at the air outlet side of the electronics rack. The outlet door cover has an opening therein. The cooled electronics system further includes a heat exchange assembly mounted to the outlet door cover of the electronics rack to reside within the opening of the outlet door cover. The heat exchange assembly includes a support frame, an air-to-liquid heat exchanger, and first and second perforated planar surfaces. The support frame facilitates mounting of the heat exchange assembly to the outlet door cover. The air-to-liquid heat exchanger is supported by the support frame and has an inlet plenum and an outlet plenum disposed along the edge of the outlet door cover hingedly mounted to the electronics rack. The inlet plenum and the outlet plenum are each in fluid communication with a respective connect coupling of the heat exchange assembly. The respective connect couplings also reside adjacent to the edge of the outlet door cover hingedly mounted to the electronics rack. The air-to-liquid heat exchanger further includes multiple horizontally-oriented heat exchange tube sections. Each heat exchange tube section includes a serpentine coolant channel having an inlet and an outlet. Each coolant channel inlet is coupled to the inlet plenum, and each coolant channel outlet is coupled to the outlet plenum. The heat exchanger further includes a plurality of fins extending from the heat exchange tube sections. The first perforated planar surface covers a first main side of the heat exchanger and the second perforated planar surface covers a second main side of the heat exchanger. Each perforated planar surface contains air flow openings to allow inlet-to-outlet air flow through the electronics rack to pass through the heat exchange assembly at the air outlet side of the electronics rack.

In a further aspect, a method for facilitating cooling of an electronics rack is provided. This method includes providing a heat exchange assembly configured to mount to an outlet door cover for an electronics rack, wherein air moves through the electronics rack from an air inlet side to an air outlet side thereof and the outlet door cover is hingedly mounted along one edge to the electronics rack at the air outlet side of the electronics rack. The provided heat exchange assembly includes a support frame for facilitating mounting of the heat exchange assembly to the outlet door cover, an air-to-liquid heat exchanger supported by the support frame, and first and second perforated planar surfaces covering a first main side and a second main side, respectively, of the air-to-liquid heat exchanger. The air-to-liquid heat exchanger includes an inlet plenum and an outlet plenum disposed adjacent to the edge of the outlet door cover hingedly mounted to the electronics rack. The plenums are each in fluid communication with a respective connect coupling of the heat exchange assembly. The respective connect couplings reside adjacent to the edge of the outlet door cover hingedly mounted to the electronics rack as well. The air-to-liquid heat exchanger further includes multiple horizontally-oriented heat exchange tube sections. Each heat exchange tube section includes a serpentine coolant channel having an inlet and an outlet. Each coolant channel inlet is coupled to the inlet plenum and each coolant channel outlet is coupled to the outlet plenum. The air-to-liquid heat exchanger further includes a plurality of fins extending from the heat exchange tube sections. The perforated planar surfaces each contain air flow openings to allow inlet-to-outlet air flow through the electronics rack to pass through the heat exchange assembly. The method further includes mounting the heat exchange assembly to the outlet door cover by affixing the support frame to the outlet door cover, wherein the heat exchange assembly resides within the opening in the outlet door cover.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics drawers each having one or more heat generating components disposed therein requiring cooling. Further, as used herein, "heat exchange assembly" means any heat exchange mechanism characterized as described herein through which liquid coolant can circulate; and includes, one or more discrete air-to-liquid heat exchangers coupled either in series or in parallel. A heat exchanger may comprise, for example, one or more coolant flow paths, formed of thermally conductive tubing (such as copper or other tubing) in thermal or mechanical contact with a plurality of air cooled cooling fins. Additionally, size, configuration and construction of the heat exchange assembly and/or air-to-liquid heat exchanger thereof as described herein below can vary without departing from the scope of the present invention.

Reference is now made to the drawings, which are not drawn to scale and are simplified for ease of understanding, wherein the same reference numbers used throughout different figures designate the same or similar components.

Figure 1A:
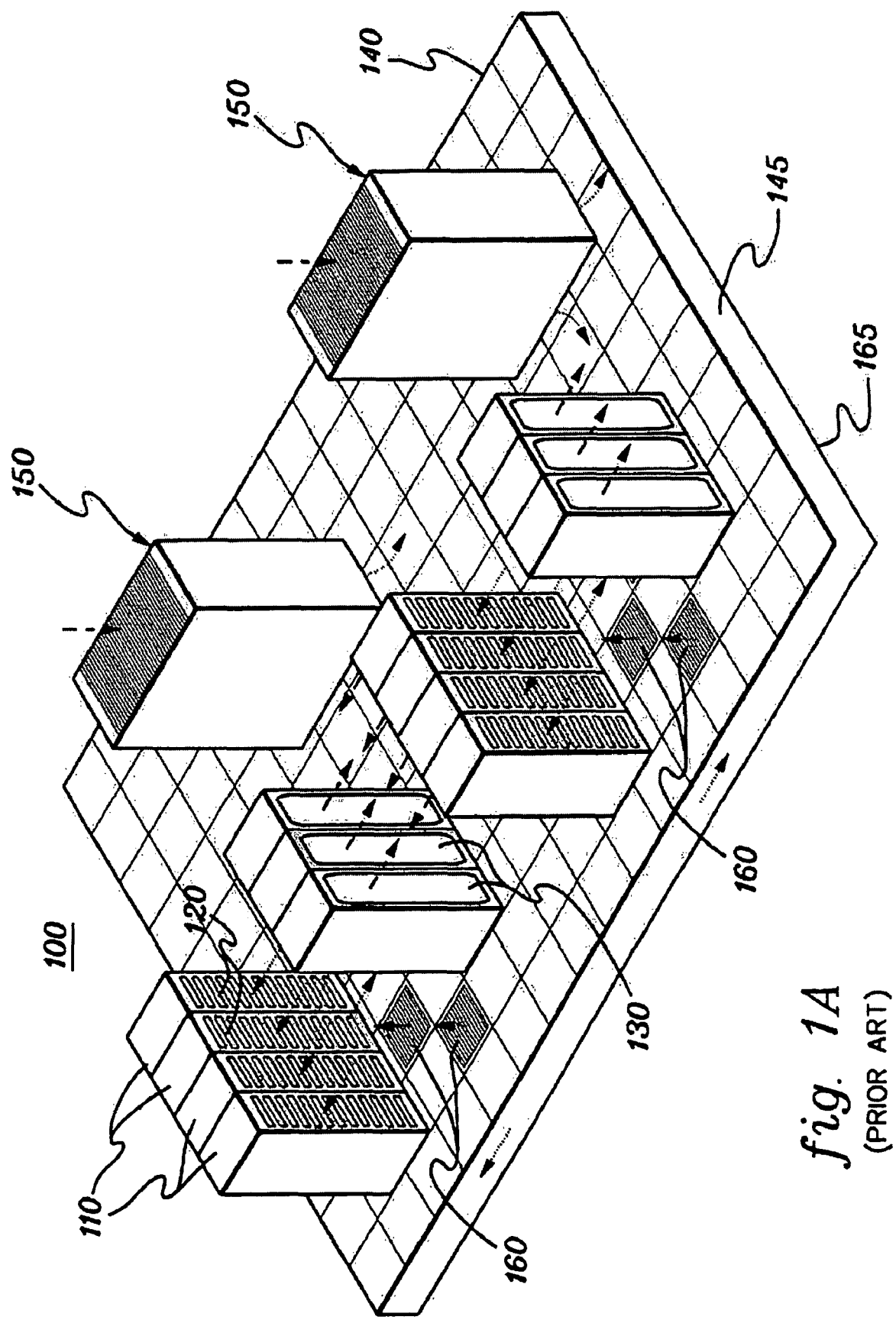
FIG. 1A depicts one embodiment of a conventional raised floor layout of an air cooled computer installation.

As shown in FIG. 1A, in a raised floor layout of an air cooled computer installation 100 typical in the prior art, multiple electronics racks 110 are disposed in one or more rows. A computer installation such as depicted in FIG. 1A may house several hundred, or even several thousand microprocessors. In the arrangement of FIG. 1A, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" aisles of the computer installation defined by opposing air outlet sides 130 of the electronics racks 110.

Figure 1B:
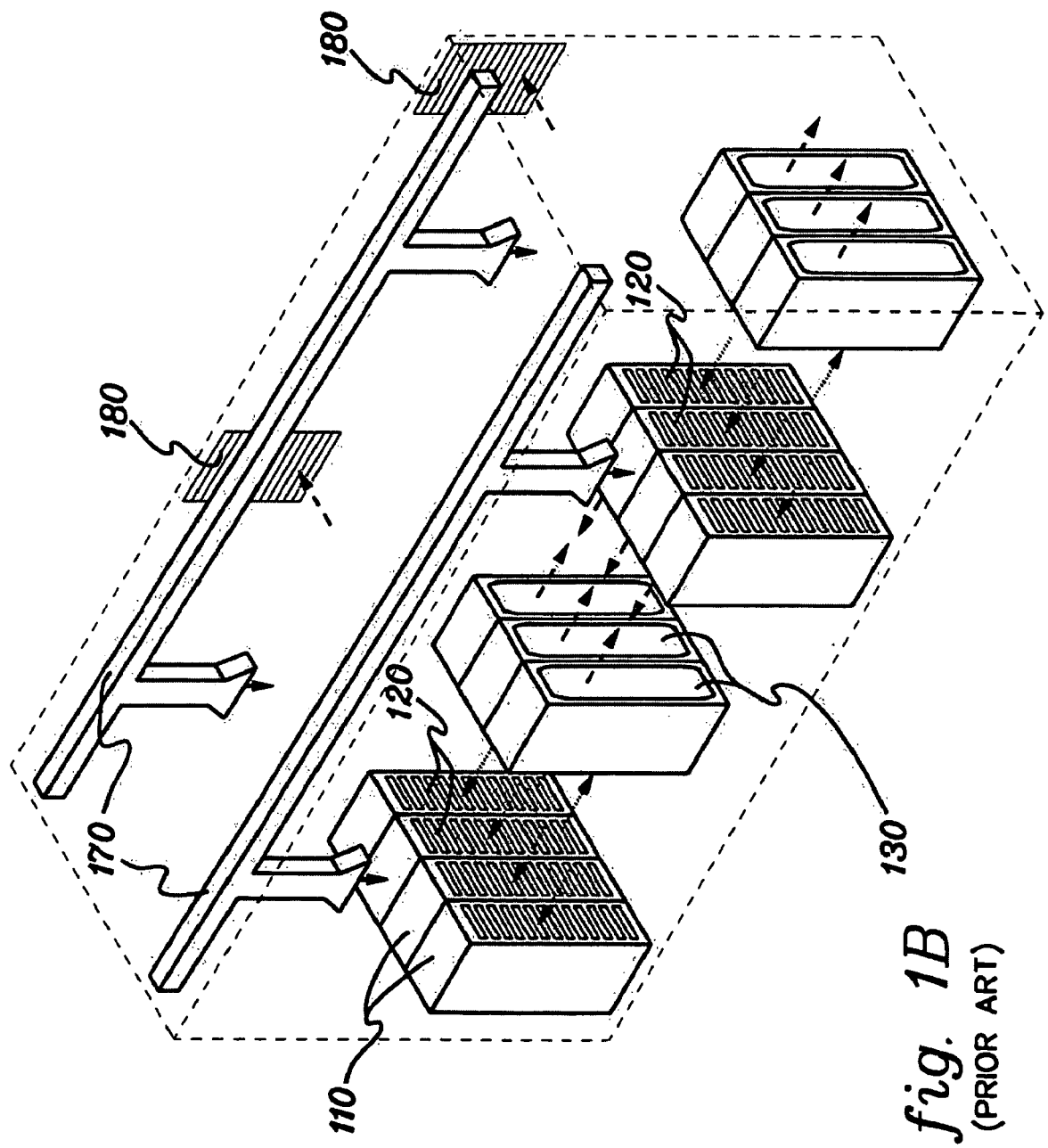
FIG. 1B depicts one embodiment of a conventional non-raised floor layout of an air cooled computer installation, wherein overhead air ducts and diffusers are employed in distributing cooled air flow to the electronics racks.

FIG. 1B depicts an alternate computer room configuration wherein multiple electronics racks 110 disposed in rows are cooled via conditioned and cooled air entering the room from overhead ducts and diffusers 170. Air exits the room via vents 180 that may be placed at different locations within the room. The ducts and diffusers 170 are disposed so as to align to the cold aisle of the multiple rows and provide cooled air to the air inlet sides 120 of the electronics racks. Air moving devices within the racks move the cooled air through the racks from their inlet-to-outlet sides to cool the heat generating components therein. Heated air is again exhausted at the hot aisles of the racks through the air outlet sides 130 of electronics racks 110. In one embodiment, returns 180 can be aligned to the hot aisles defined by the opposing air outlet sides 130 of the electronics racks.

Figure 2:
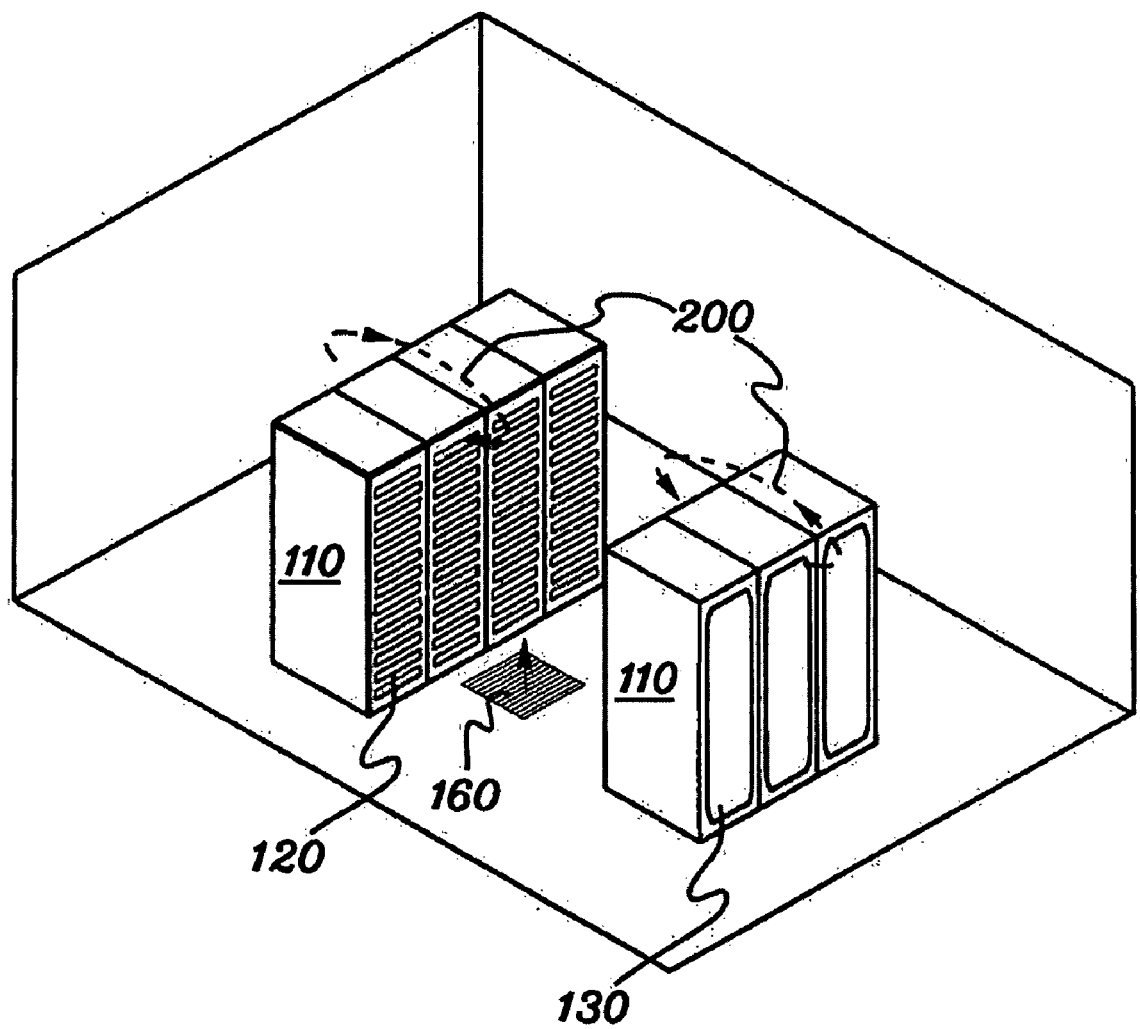
FIG. 2 depicts one problem addressed by the present invention, showing recirculation air flow patterns in one implementation of a raised floor layout of an air cooled computer installation.

Due to the ever increasing air flow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This recirculating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system (s) or electronic system(s) within the racks. Data center equipment is typically designed to operate with rack air inlet temperatures in the 10-35° C. range. For a raised floor layout such as depicted in FIG. 1A, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to a lower processing capacity. Also, computer installation equipment almost always represents a high capital investment to the customer. Thus, it is of significant importance, from a product reliability and performance view point, and from a customer satisfaction and business perspective, to limit the temperature of the inlet air to the rack unit to be within a desirable range. The efficient cooling of such computer and electronic systems, and the amelioration of localized hot air inlet temperatures to one or more rack units due to recirculation of air currents, are addressed by the apparatuses and methods disclosed herein.

Figure 3:
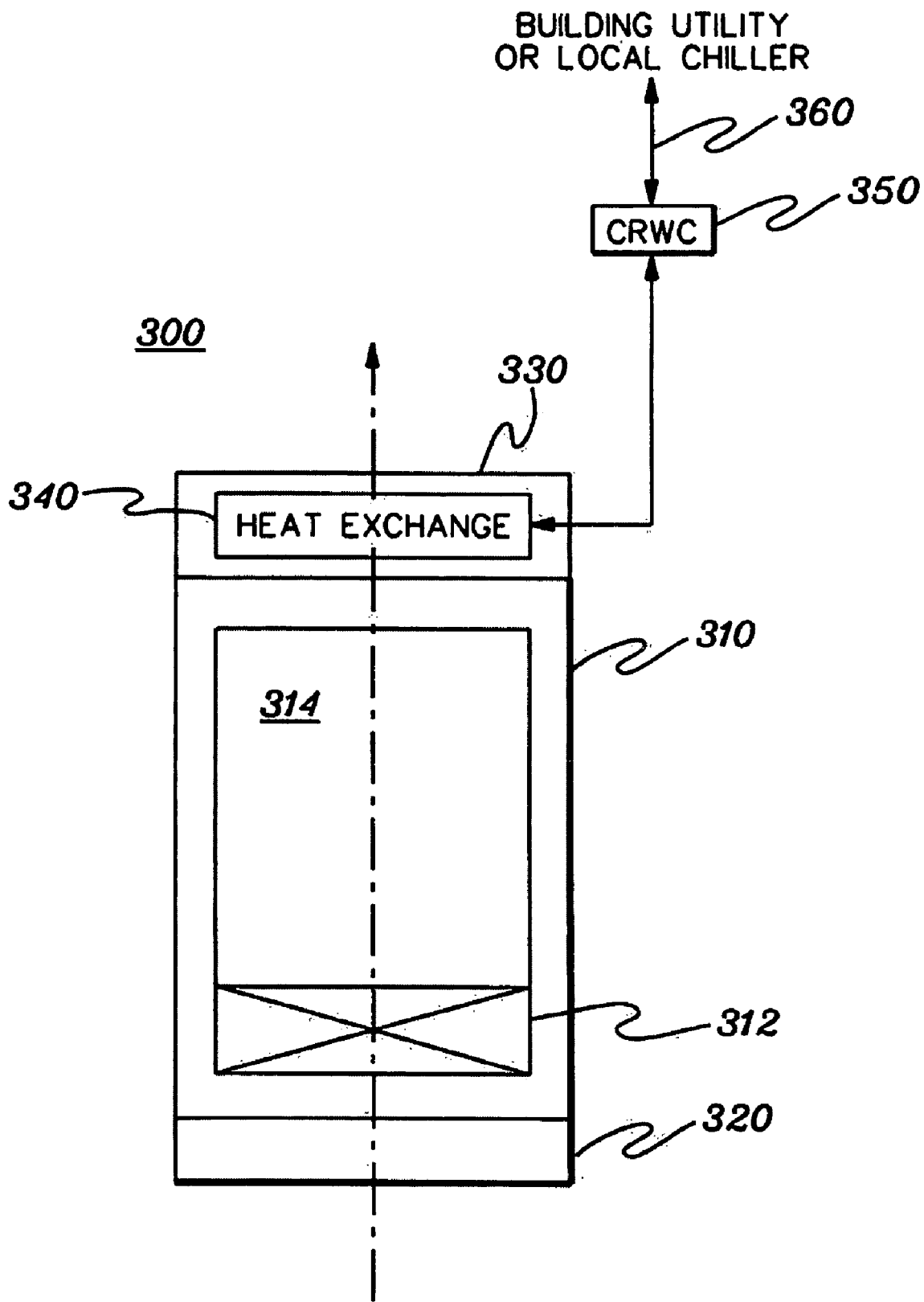
FIG. 3 is a cross-sectional plan view of one embodiment of an electronics rack with a heat exchange assembly disposed within an outlet door cover, in accordance with an aspect of the present invention.

FIG. 3 depicts one embodiment of a cooled electronics system, generally denoted 300, in accordance with an aspect of the present invention. In this embodiment, electronics system 300 includes an electronics rack 310 having an inlet door cover 320 and an outlet door cover 330 which have openings to allow for the ingress and egress of external air from the inlet side to the outlet side of the electronics rack 310. The system further includes at least one air moving device 312 for moving external air across at least one electronics drawer unit 314 positioned within the electronics rack. Disposed within outlet door cover 330 is a heat exchange assembly 340. Heat exchange assembly 340 includes an air-to-liquid heat exchanger through which the inlet-to-outlet air flow through the electronics rack passes. A computer room water conditioner (CRWC) 350 is used to buffer heat exchange assembly 340 from the building utility or local chiller coolant 360, which is provided as input to CRWC 350. Details of a computer room water conditioning unit are described in commonly assigned U.S. patent application Ser. No. 10/930,079, entitled "Cooling System and Method Employing Auxiliary Thermal Capacitor Unit for Facilitating Continuous Operation of an Electronics Rack," the entirety of which is hereby incorporated herein by reference. The CRWC 350 provides system water or system coolant to heat exchange assembly 340. Heat exchange assembly 340 removes heat from the exhausted inlet-to-outlet air flow through the electronics rack for transfer via the system water or coolant to CRWC 350. Advantageously, providing a heat exchange assembly with an air-to-liquid heat exchanger such as disclosed herein at the outlet door cover of one or more electronics racks in a computer installation can significantly reduce heat loads on existing air conditioning units within the computer installation, and facilitate the cooling of the rack-mounted electronics units.

Figure 4:
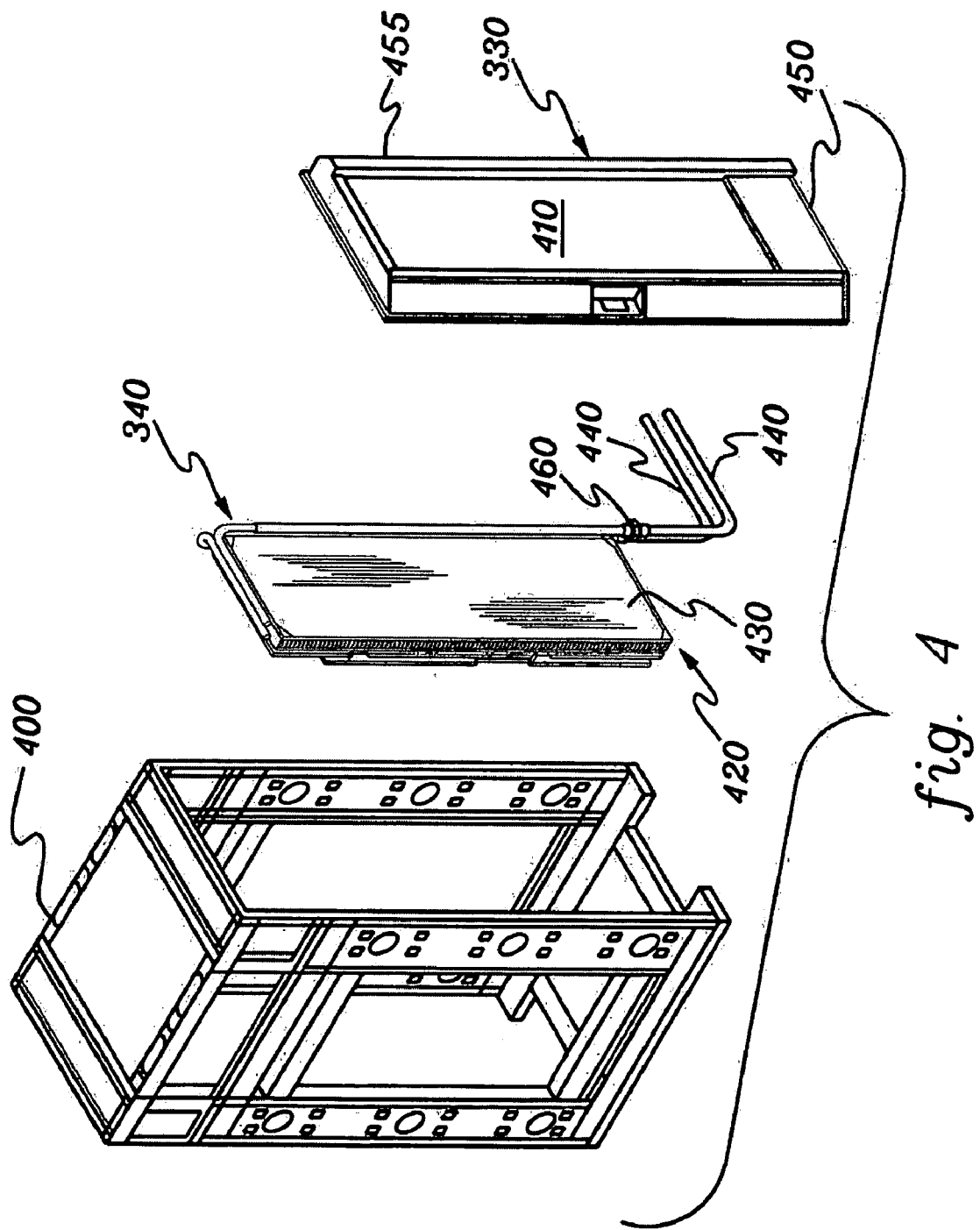
FIG. 4 is a partially exploded isometric view of one embodiment of an electronics rack frame, a heat exchange assembly and an outlet door cover, in accordance with an aspect of the present invention.

FIG. 4 depicts further details of one embodiment of an electronics rack frame 400, outlet door cover 330 and heat exchange assembly 340, in accordance with an aspect of the present invention. In this embodiment, heat exchange assembly 340 is configured to reside within and cover an opening 410 in outlet door cover 330. Further, outlet door cover 330 is assumed to be (in one implementation) a modified outlet door cover. This modified outlet door cover is designed to replace an existing acoustical outlet door cover (not shown) of the electronics rack, in which case the modified outlet door cover and heat exchange assembly disclosed herein may be retrofitted to an existing electronics rack within a conventional computer room installation. As explained further below, one feature of the present invention is that air flow impedance through the modified outlet door cover and heat exchange assembly mounted thereto is less than or equal to air flow impedance through the existing outlet door cover of the electronics rack. This is achieved, in one aspect, by designing the heat exchange assembly to balance air flow impedance through the heat exchange assembly with air-to-liquid heat exchange efficiency of the assembly. By trading off heat exchange efficiency, air flow impedance through the assembly can be controlled. This advantageously allows use of a heat exchange assembly such as disclosed herein, without requiring additional air moving devices within the electronics rack or associated with the heat exchange assembly to achieve the desired goal of alleviating heat load on the computer room air conditioning units.

Figure 9B:
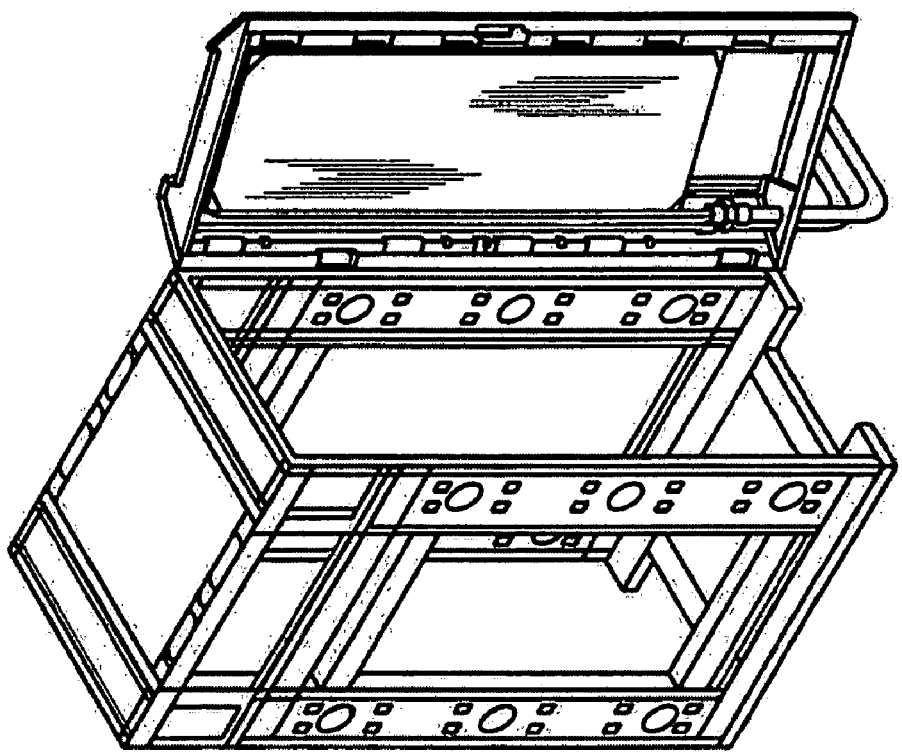
FIG. 9B is an isometric view of the structure of FIG. 9A, showing the outlet door cover, with the heat exchange assembly mounted therein, in an open position relative to the electronics rack frame, in accordance with an aspect of the present invention.
Figure 9A:
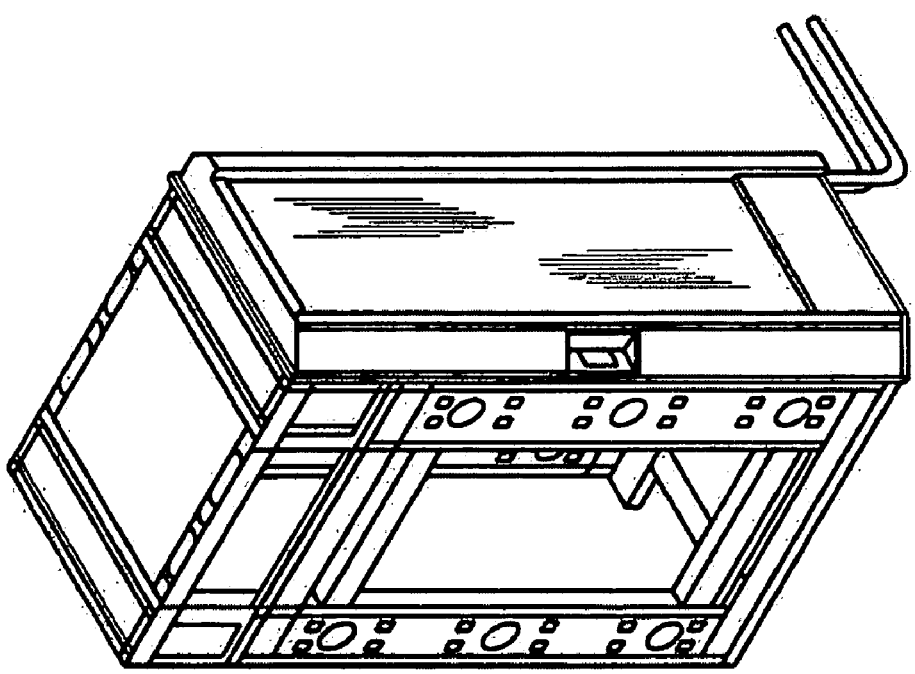
FIG. 9A is an isometric view of the partially assembled structure of FIG. 4 showing the heat exchange assembly mounted within the outlet door cover, and the outlet door cover hingedly secured to the electronics rack frame and in a closed position relative to the electronics rack frame, in accordance with an aspect of the present invention.

As shown in FIG. 4, heat exchange assembly 340 includes an air-to-liquid heat exchanger 420, as well as protective plates (i.e., perforated planar surfaces 430) mounted to the main sides of the heat exchanger to protect the heat exchanger from damage. The heat exchange assembly further includes inlet and outlet manifolding for delivering and removing liquid coolant to multiple heat exchange tube sections of the heat exchanger, as well as two quick connect couplings. The outlet door cover 330 is hingedly mounted at one edge for pivoting open and closed as shown in FIGS. 9A & 9B.

Conditioned coolant is delivered to the heat exchange assembly from the CRWC (FIG. 3) using, for example, flexible ¾ inch diameter rubber supply and return hoses 440 of variable length. Short hoses may be employed for connecting to hard plumbing disposed near the electronics rack, or longer hoses (e.g., up to 50 feet in length), may be used for connecting to a centralized pump unit. Hoses 440 are brought into the outlet door cover 330 adjacent to the hinge axis of the door through a removable hose retention device in the base 450 of the door. As noted, the inlet manifold and the outlet manifold for the heat exchange assembly 340 are also disposed along one side of the heat exchanger adjacent to the hinged edge 455 of the outlet door cover. Two quick connect couplings 460 are provided for coupling to the supply and return hoses 440 and are disposed below the inlet and outlet manifolding at the one side of the heat exchanger adjacent to the hinged edge 455 of the outlet door cover.

The embodiment of FIG. 4 assumes a raised floor environment, where hoses are routed through floor tile cutouts (not shown) into the outlet door cover 330 for connecting to quick connect couplings 460. In a non-raised floor environment, right angle adapters could be installed at the end of each hose 440 to allow the coolant to make a sharp turn at the base of the outlet door cover. Hoses 440 are configured to plug into each manifold via industry standard, hydraulic, quick connect couplings 460. By way of example, connect couplings 460 could comprise a ¾ inch quick connect female coupling and a ¾ inch quick connect male coupling, such as Series 60 general purpose couplings offered by Parker Hannifin Corporation of Minneapolis, Minn. Once hoses are plugged into their respective couplings and secured, the hoses (or adapters) rotate around each other as the outlet door cover 330 is pivoted open and closed, providing a minimum of movement to the hoses (see FIGS. 9A & 9B).

Figure 5:
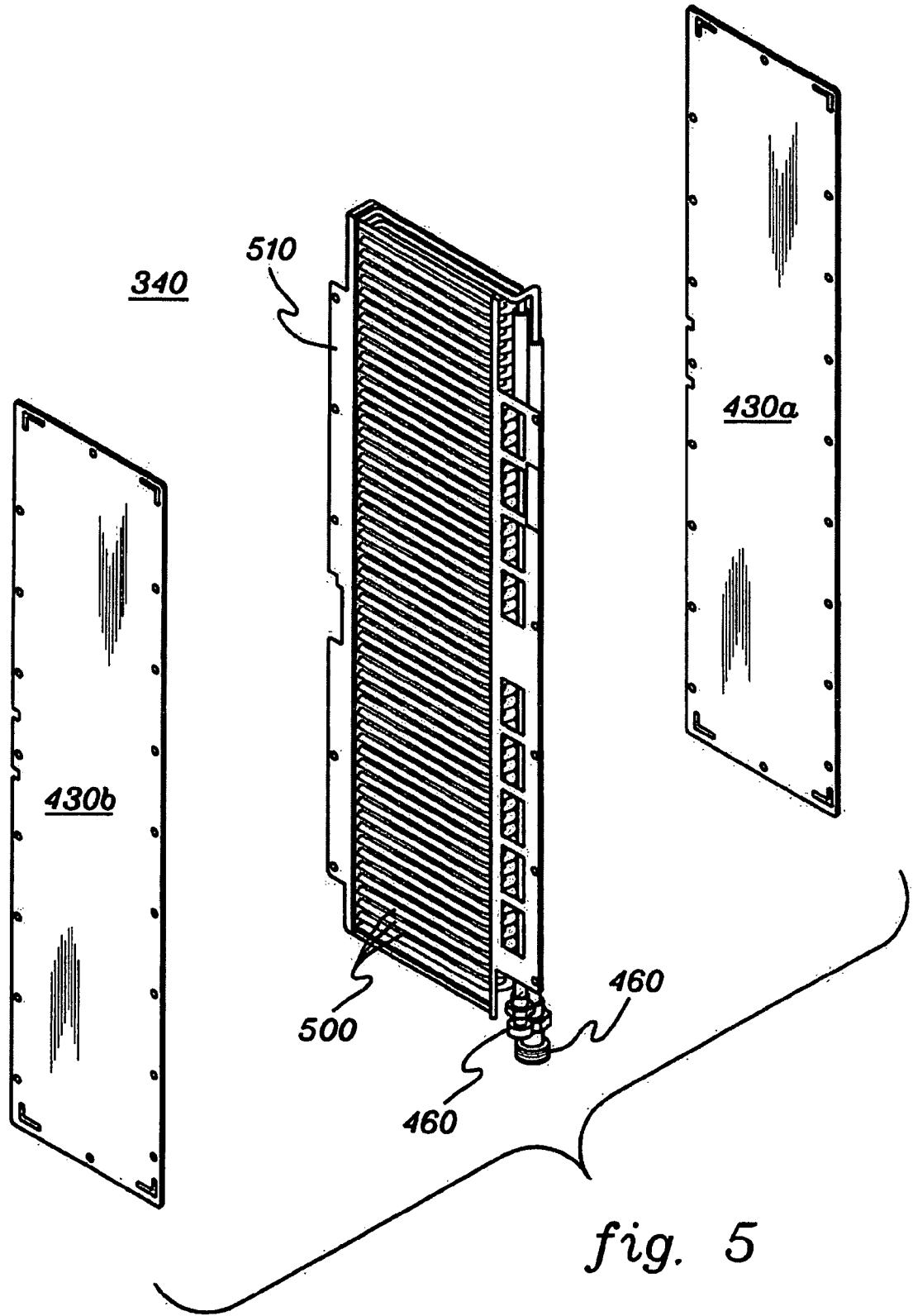
FIG. 5 is a partially exploded isometric view of one embodiment of the heat exchange assembly of FIG. 4, showing the first and second perforated planar surfaces removed from a simplified air-to-liquid heat exchanger, in accordance with an aspect of the present invention.
Figure 6:
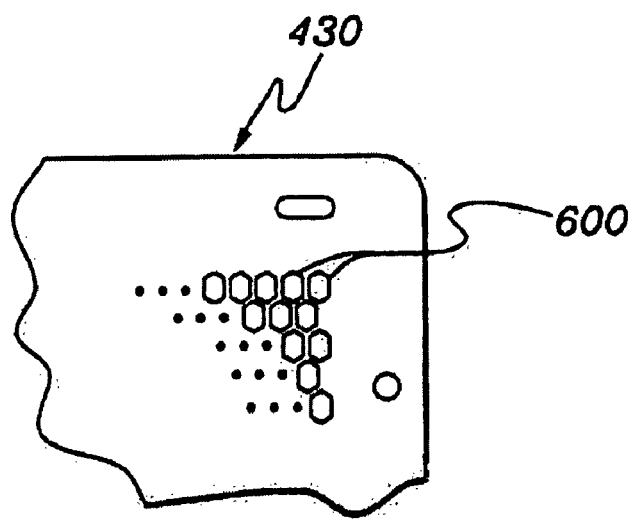
FIG. 6 is a partial plan view of one embodiment of a perforated planar surface for use with the heat exchange assembly of FIG. 5, in accordance with an aspect of the present invention.

FIG. 5 depicts in greater detail one embodiment of various components of the heat exchange assembly 340 of FIG. 4. The assembly includes an air-to-liquid heat exchanger, generally denoted 500, various aspects of which are shown. The assembly further includes a support frame 510 which facilitates mounting of the heat exchange assembly to the outlet door cover (see FIG. 4), and first and second perforated planar surfaces 430a, 430b, for covering first and second main sides of the air-to-liquid heat exchanger, respectively. In one embodiment, the perforated planar surfaces comprise metal plates having appropriate air flow openings to allow inlet-to-outlet air flow through the electronics rack to readily pass through the heat exchange assembly. One embodiment of air flow openings of the perforated planar surfaces is depicted in FIG. 6. In this embodiment, each perforated planar surface 430 has a plurality of openings 600 disposed throughout the plate. As one example, openings 600 comprise hexagon-shaped openings which maximize air flow through the perforated surfaces, while still providing the desired isolation of the air-to-liquid heat exchanger.

Figure 7:
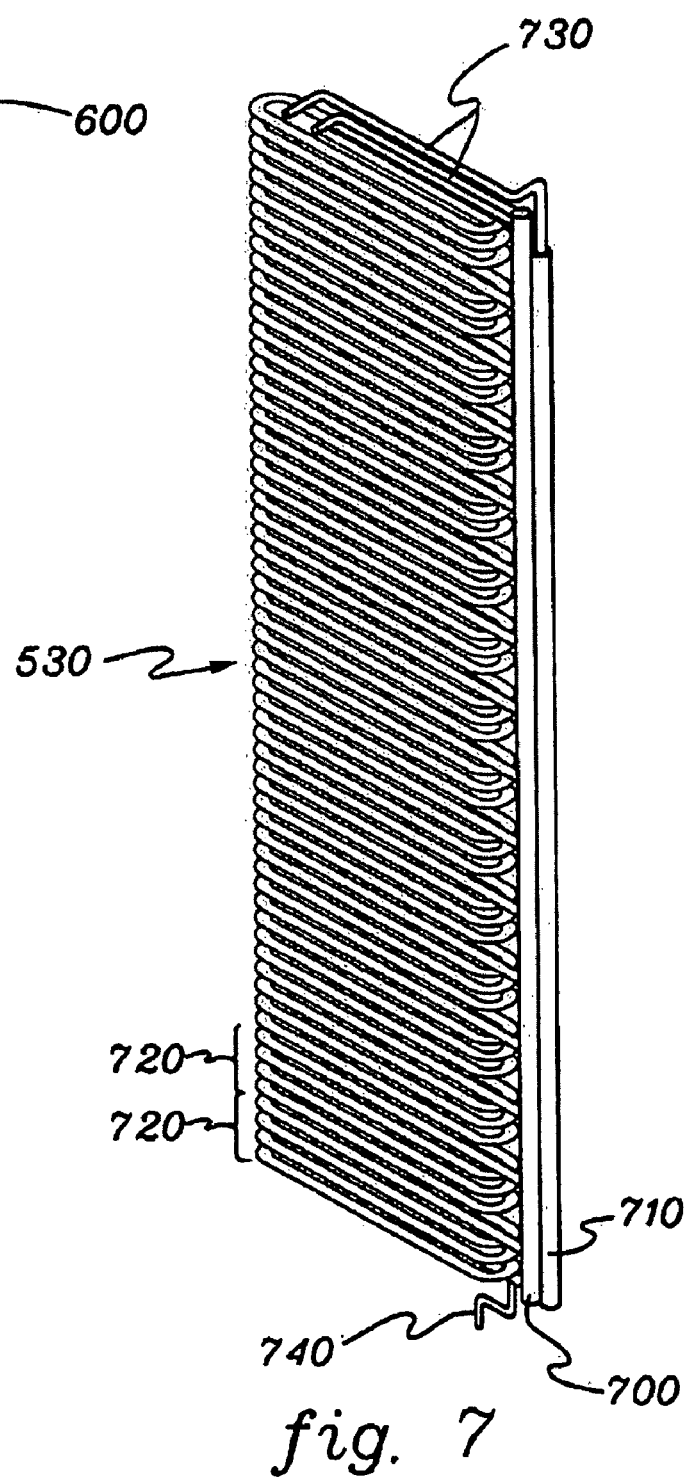
FIG. 7 is an isometric view of one embodiment of a simplified air-to-liquid heat exchanger (without fins shown) wherein multiple horizontally-oriented heat exchange tube sections each couple to an inlet plenum and an outlet plenum disposed at one side of the air-to-liquid heat exchanger, in accordance with an aspect of the present invention.

Various components of the air-to-liquid heat exchanger 500 shown in FIG. 5 are depicted in greater detail in FIG. 7. As shown, these heat exchange components include multiple horizontally-oriented heat exchange tube sections 720 which couple to the inlet and outlet manifold. In this example, the inlet and outlet manifolding comprise a liquid inlet plenum 700 and a liquid outlet plenum 710, each of which is a tube of sufficient diameter to provide coolant flow to the multiple horizontally-oriented heat exchange tube sections 720. Each heat exchange tube section defines a serpentine cooling channel having an inlet and an outlet. The inlets of the heat exchange tube sections couple to inlet plenum 700, while the outlets of the heat exchange tube sections couple to outlet plenum 710. Each plenum 700, 710 is connected to a respective quick connect coupling 460 as shown in FIG. 5. Further, each heat exchange tube section 720 comprises at least one of a continuous tube or multiple tubes connected together to form one continuous serpentine cooling channel. In the embodiment shown, each heat exchange tube section is a continuous tube having a first diameter, and each plenum 700, 710 is a tube having a second diameter, wherein the second diameter is greater than the first diameter. The first and second diameters are chosen to ensure adequate supply of coolant flow through the multiple horizontally-oriented heat exchange tube sections 720. In one embodiment, each heat exchange tube section aligns to a respective electronics drawer of an electronics rack to which the heat exchange assembly is to be coupled via an outlet door cover attached to the outlet side thereof.

Small air bleed lines and valves 730 are conveniently located at the top of each plenum 700, 710, and are routed to the opposite side of the outlet door cover in order to prevent inadvertent drips from impacting electronics within the electronics rack when the outlet door cover is open and air is being bled from the heat exchange assembly. Air bleed tools can be used to capture any exiting water during start up. A third small drain line and valve 740 is located at the lowest point in the plenum system to facilitate draining the heat exchange assembly if necessary. By way of example, the air bleed valves at the ends of the air bleed lines could comprise Schrader valves offered by J/B Industries of Auroua, Ill.

Figure 10:
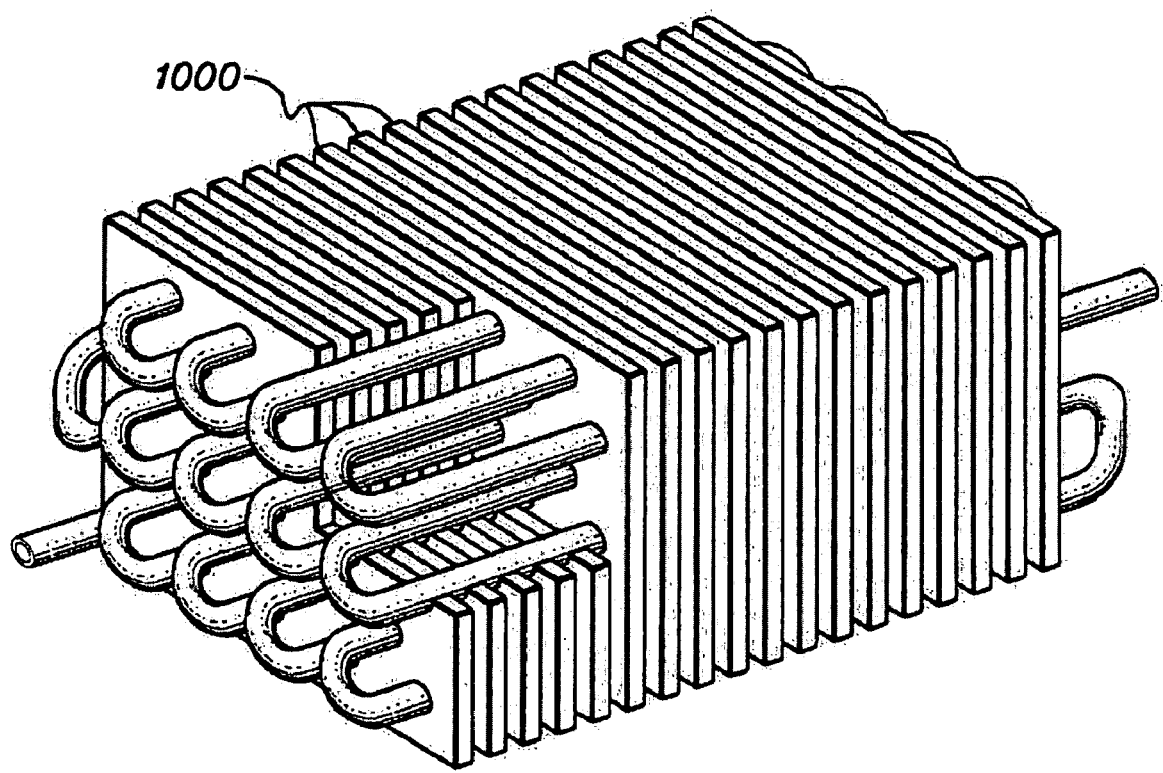
FIG. 10 is a partially cutaway isometric view of one embodiment of an air-to-liquid heat exchanger having a plurality of fins surrounding and extending from a core tube section, in accordance with an aspect of the present invention.

Although not shown in FIG. 7, the heat exchange tube sections further include a plurality of fins (such as fins 1000 in FIG. 10) extending from the tubes to facilitate heat transfer from air exhausted out the back of the electronics rack to liquid coolant flowing through the serpentine cooling channels of the individual heat exchange tube sections. In one embodiment, the plurality of fins comprise aluminum fins extending from the individual tubes, which could be constructed of copper tubing. In one implementation, the fins are brazed to the tubing. As explained above, the positioning, density, thickness and depth of the fins are all selected to control air flow impedance through the resultant air-to-liquid heat exchanger, and hence through the heat exchange assembly when the assembly is mounted to the outlet door cover at the back of the electronics rack. Additionally, the number and diameter of tubes of the individual heat exchange tube sections, as well as the size, configuration and placement of the air flow openings in the first and second perforated planar surfaces are selected to control the overall air flow impedance through the heat exchange assembly. By so controlling the air flow impedance, the resultant air-to-liquid heat exchange transfer effectiveness of the heat exchange assembly is expected to be less than optimum. For example, a heat exchange effectiveness (defined as a ratio of heat removed by the heat exchange assembly to the heat dissipated within the electronics rack) of fifty to sixty percent may be required in order to achieve a desired air flow impedance through the assembly. As noted, one design objective for the heat exchange assembly is that the heat exchange assembly, when mounted to the outlet door cover, has an air flow impedance which matches or is less than the air flow impedance of any existing rear door cover of an existing electronics rack installation to which the assembly is to be attached. By so matching the air flow impedance, the need for an additional air moving device is avoided. By way of specific example, if an electronics rack has a total air flow of 1500 cfm (cubic feet per minute) and the pressure drop across the existing rear door cover at that air flow is 0.03 inches of water, then the heat exchange assembly is designed to have an air side pressure drop of less than or equal to 0.03 inches of water at 1500 cfm. Under this condition, the heat exchange effectiveness may be 50%-60%, but is still more than adequate to alleviate heat load on the room air conditioning unit(s) of a computer room installation.

Figure 8B:
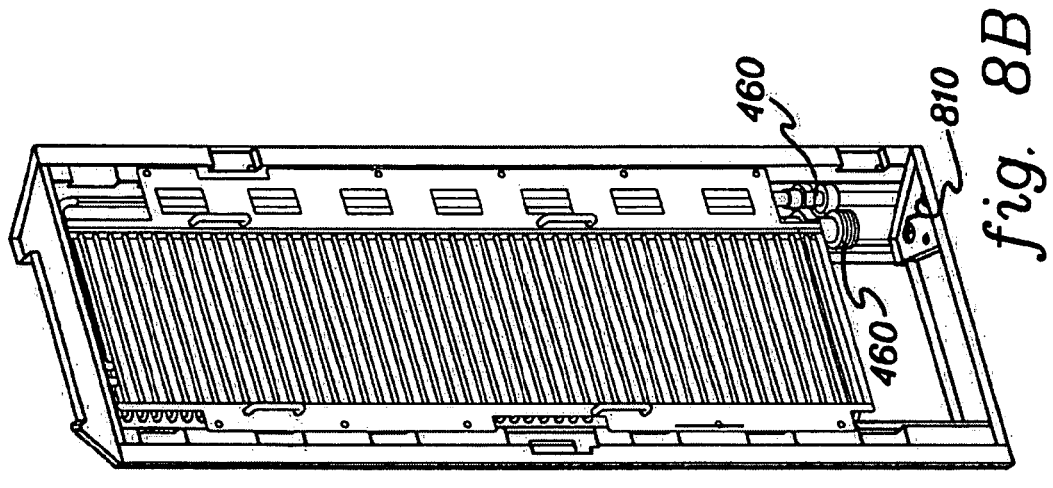
FIG. 8B is an assembled view of the outlet door cover and simplified heat exchange assembly of FIG. 8A, in accordance with an aspect of the present invention.
Figure 8A:
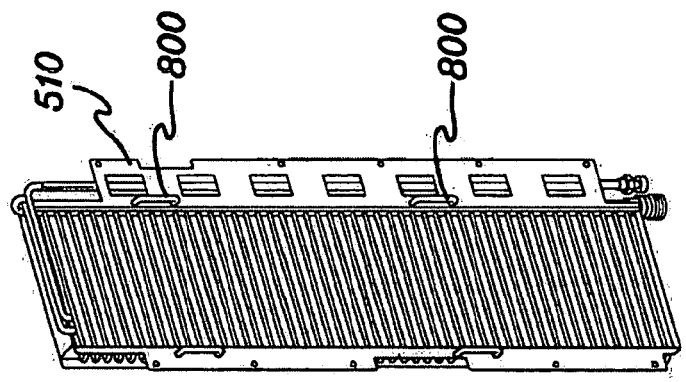
FIG. 8A is a partially exploded isometric view of one embodiment of the inside of an outlet door cover and a simplified heat exchange assembly (wherein perforated planar plates and fins of the heat exchange assembly of are not shown), in accordance with an aspect of the present invention.
Figure 8A:
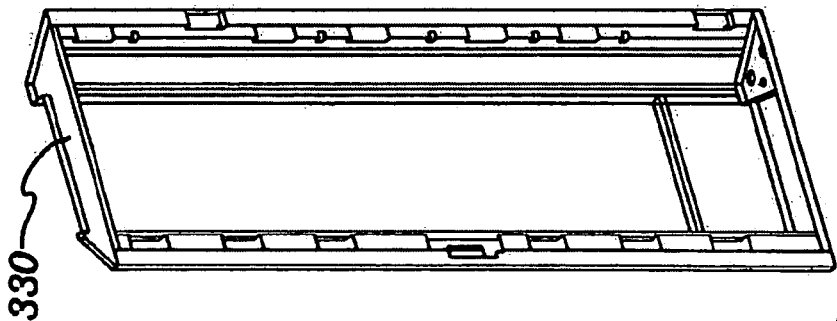

FIGS. 8A & 8B depict details of one embodiment of the inside of an outlet door cover 330 and a partial heat exchange assembly in accordance with the present invention. In this embodiment, the outlet door cover 330 and heat exchanger 500 and support frame 510 are similar to those described above in connection with FIGS. 3-7, however, the inlet and outlet plenums of the heat exchange assembly and the hinged edge of the outlet door cover are transposed from the embodiment of FIGS. 3-7. Otherwise, the structures are analogous. As shown, support frame 510 is configured to mate to an inside surface of outlet door cover 330, and be attached thereto via any appropriate connectors, such as bolts or screws. Support frame 510 further includes multiple handles 800 for use in manually moving the heat exchange assembly. Further, openings 810 in a bottom surface of the outlet door cover 330 are provided to facilitate connecting of supply and return hoses to the quick connect couplings disposed within the outlet door cover 330 when the heat exchange assembly is mounted thereto.

As noted, the heat exchange assembly disclosed herein is advantageously designed to function without added air moving devices within the electronics rack. Thus, the air impedance of the heat exchange assembly is controlled to match (or be less than) that of a conventional door or acoustical material present at the back of a typical electronics device. This is achieved by controlling several design variables, including tube number and size employed in the tube sections of the heat exchanger, and fin number, thickness and depth (in the direction of air flow) used in the air-to-liquid heat exchanger.

The heat exchange assembly can also be designed to operate using above dew point coolant at all times, thus eliminating the chance for condensation to occur, and the need for condensation monitoring and draining devices. The materials and wall thicknesses are chosen to accommodate the air impedance design. Strict braze processing definition and control are employed along with multiple test points in the build process for robust, controlled component fabrication. In combination, these considerations contribute to and ensure a leak-proof, highly reliable product which meets the design objectives.

Ease of installation is designed into the heat exchange assembly disclosed herein through the use of a minimal number of parts and the use of quick connect couplings. Installation involves attaching an upper and lower hinge to the outlet door cover, hanging the outlet door cover on the hinges, with the heat exchange assembly secured thereto, and coupling the supply and return hoses to the quick connect couplings. The hoses are then secured within the outlet door cover using a hose retention plate and, for example, a retaining thumb screw. Start up is completed by initializing the supply coolant (e.g., water) and attaching a bleed tool to the upper bleed valves (until all air is removed from the piping). For purposes of handling and hanging the door assembly, components are designed for reduced weight where possible. An aluminum door housing can be employed with folded and welded plates making up its vertical members, creating a "honeycomb" effect and providing a high strength-to-weight ratio. The heat exchange tube sections comprise small diameter tubes, and minimal diameter manifolds are used, in combination with aluminum fins for the heat exchange tube sections to provide the highest possible heat removal area, at the lowest possible weight. Ideally, the total assembly is designed to be under the 70 pound limit for unassisted lifting.

Safety considerations are also taken into account throughout the design. For ease of handling, handles are provided on the inner side of the support frame. Further, to protect fins from damage and protect an operator or bystander from contacting the sharp fins, protective perforated plates are installed to reside across the two main sides of the heat exchanger. Further, in the area around the supply and return manifold couplings, all sharp edges and corners are eliminated.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack, the apparatus comprising:
    a heat exchange assembly configured to mount to an outlet door cover for an electronics rack, wherein air moves through the electronics rack from an air inlet side to an air outlet side thereof and the outlet door cover is hingedly mounted along one edge to the electronics rack at the air outlet side of the electronics rack, and wherein the heat exchange assembly comprises:
        a support frame for facilitating mounting of the heat exchange assembly to the outlet door cover, wherein when mounted to the outlet door cover, the heat exchange assembly covers at least a portion of an opening in the outlet door cover;

an air-to-liquid heat exchanger supported by the support frame, the air-to-liquid heat exchanger having an inlet plenum and an outlet plenum disposed adjacent to the edge of the outlet door cover hingedly mounted to the electronics rack when the heat exchange assembly is mounted to the outlet door cover, wherein the inlet plenum and the outlet plenum are each in fluid communication with a respective connect coupling of the heat exchange assembly, the respective connect couplings residing adjacent to the edge of the outlet door cover hingedly mounted to the electronics rack when the heat exchange assembly is mounted to the outlet door cover, and wherein the air-to-liquid heat exchanger further comprises at least one heat horizontally-oriented exchange tube section, each heat exchange tube section comprising a coolant channel having an inlet and an outlet, each coolant channel inlet being coupled to the inlet plenum and each coolant channel outlet being coupled to the outlet plenum, and wherein the air-to-liquid heat exchanger further comprises a plurality of fins extending from the at least one horizontally-oriented heat exchange tube section and wherein each heat exchange tube section comprises at least one tube having a first diameter, and wherein the inlet plenum and the outlet plenum each comprise a tube having a second diameter, wherein the second diameter is greater than the first diameter, and wherein the inlet plenum and outlet plenum each extend vertically and adjacent to the edge of the outlet door cover hingedly mounted to the electronics rack, and wherein inlet-to-outlet air flow through the electronics rack is horizontal;

at least one of a first perforated surface covering a first main side of the air-to-liquid heat exchanger or a second perforated surface covering a second main side of the air-to-liquid heat exchanger, each perforated surface containing air flow openings to allow inlet-to-outlet air flow through the electronics rack to pass through the heat exchange assembly; and wherein the air-to-liquid heat exchanger is configured and positioned to cool air exhausting from the electronics rack into a data center containing the electronics rack, and thereby reduce demand on one or more data center air-conditioning units.

2. The apparatus of claim 1, wherein each heat exchange tube section comprises a horizontally extending, serpentine coolant channel.

3. The apparatus of claim 2, wherein the heat exchange assembly fixedly mounts to the outlet door cover to reside within and pivot therewith, and cover the opening in the outlet door cover, and wherein the first perforated surface and second perforated surface comprise a first perforated metal plate and a second perforated metal plate, respectively.

4. The apparatus of claim 2, wherein the electronics rack further comprises multiple electronics drawers, and wherein the air-to-liquid heat exchanger comprises multiple heat exchange tube sections, each heat exchange tube section aligning to a respective electronics drawer of the multiple electronics drawers when the heat exchange assembly is mounted to the outlet door cover.

5. The apparatus of claim 1, wherein the connect couplings of the heat exchange assembly are disposed within the outlet door cover when the heat exchange assembly is mounted to the outlet door cover, and are below the air-to-liquid heat exchanger of the heat exchange assembly.

6. The apparatus of claim 1, wherein multiple characteristics of the at least one heat exchange tube section, the plurality of fins extending from the at least one heat exchange tube section, and the first and second perforated surfaces are configured to balance air flow impedance through the heat exchange assembly with air-to-liquid heat exchange efficiency of the heat exchange assembly, and wherein the electronics rack further comprises at least one existing air moving device for moving air from the air inlet side to the air outlet side thereof and wherein air flow impedance through the heat exchange assembly is controlled so that inlet-to-outlet air flows through the heat exchange assembly when mounted to the outlet door cover, and inlet-to-outlet air flow is operationally sufficient, employing the at least one existing air moving device of the electronics rack.

7. The apparatus of claim 6, wherein the outlet door cover comprises a modified outlet door cover, and the electronics rack further comprises an existing outlet door cover lacking the heat exchange assembly, the modified door cover with the heat exchange assembly mounted thereto being configured to replace the existing outlet door cover of the electronics rack, and wherein the multiple characteristics of the at least one heat exchange tube section, the plurality of fins extending from the at least one heat exchange tube section, and the first and second perforated surfaces, are configured so that air flow impedance through the modified outlet door cover with the heat exchange assembly mounted thereto is less than or equal to air flow impedance through the existing outlet door cover.

8. The apparatus of claim 6, wherein the multiple characteristics comprise at least some of fin density, fin thickness, and fin depth in the direction of air flow, number and diameter of tubes of the at least one heat exchange tube section, and size, configuration and placement of air flow openings in the first and second perforated surfaces, and wherein configuring the multiple characteristics to balance air flow impedance through the heat exchange assembly with air-to-liquid heat exchange effectiveness of the heat exchange assembly results in reduced heat exchange effectiveness of the heat exchange assembly.

9. The apparatus of claim 1, wherein the inlet plenum and the outlet plenum of the air-to-liquid heat exchanger are disposed along one side of the air-to-liquid heat exchanger, and wherein the heat exchange assembly further comprises a first air bleed line and a second air bleed line, the first and second air bleed lines being coupled to the inlet and outlet plenums, respectively, and having ends extending to an opposite side of the air-to-liquid heat exchange, wherein when the heat exchange assembly is mounted to the outlet door cover and the outlet door cover is pivoted open, the ends of the first and second air bleed lines extend away from electronics of the electronics racks.

* * * * *